United States Patent [19]

Cirri

[11] Patent Number: 5,241,243
[45] Date of Patent: Aug. 31, 1993

[54] DEVICE WITH UNHEATED HOLLOW CATHODE FOR THE DYNAMIC GENERATION OF PLASMA

[75] Inventor: Gianfranco Cirri, Florence, Italy

[73] Assignee: Proel Tecnologie S.p.A., Florence, Italy

[21] Appl. No.: 844,842

[22] Filed: Mar. 3, 1992

[30] Foreign Application Priority Data

Mar. 4, 1991 [IT] Italy .................. FI/91/A44

[51] Int. Cl.5 .............................. H05H 1/24
[52] U.S. Cl. ....................... 315/111.21; 315/111.81; 313/231.31
[58] Field of Search .............. 315/111.21, 111.71, 315/111.81; 313/231.31; 250/423 R

[56] References Cited

U.S. PATENT DOCUMENTS

| | | | |
|---|---|---|---|
| 4,301,391 | 11/1981 | Seliger et al. | 315/111.21 X |
| 4,458,180 | 7/1984 | Sohval et al. | 315/111.21 X |
| 4,714,834 | 12/1987 | Shubaly | 315/111.81 X |
| 4,749,912 | 6/1988 | Hara et al. | 315/111.81 |
| 4,785,220 | 11/1988 | Brown et al. | 315/111.81 |
| 4,800,281 | 1/1989 | Williamson | 315/111.81 X |
| 5,075,594 | 12/1991 | Schumacher et al. | 315/111.21 |

Primary Examiner—Eugene R. LaRoche
Assistant Examiner—Do Hyum Yoo
Attorney, Agent, or Firm—McGlew and Tuttle

[57] ABSTRACT

A hollow cylinder (3) of suitable material (the cathode) and one or more anodes (5, 7) of suitable shape and dimensions permits the generation of high-density plasma capable of being used particularly (but not exclusively) for applications in space. The plasma is produced by an electrical discharge in a gas which flows in the device through the cathode (3) and suitable orifices (8, 27) formed in the anodes (5, 7) in order to create a pressure difference between the cathode cavity (3C) in which the discharge is to be initiated and the exterior of the device. The discharge is initiated in the first place between the hollow cathode (3) and the first anode (5) and is then transmitted to the following anodes. The cathode (3), unlike the usual hot cathodes, not only does not have a filament to heat it to a suitable temperature before the initiation of the discharge, but can operate even if kept suitably cold.

20 Claims, 2 Drawing Sheets

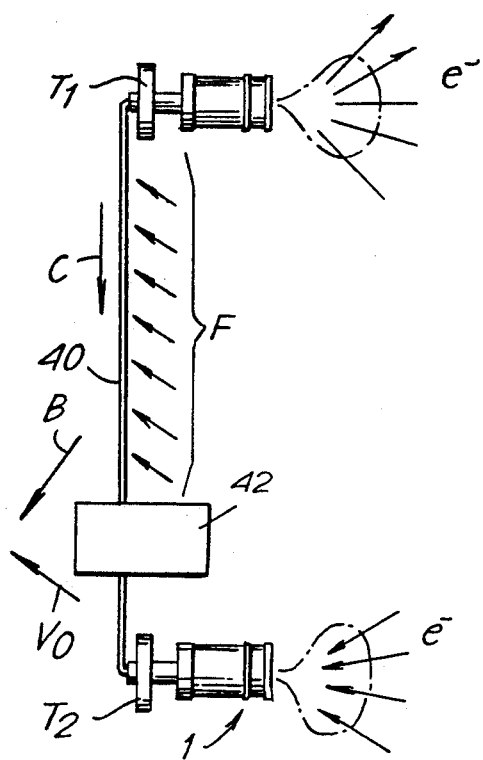
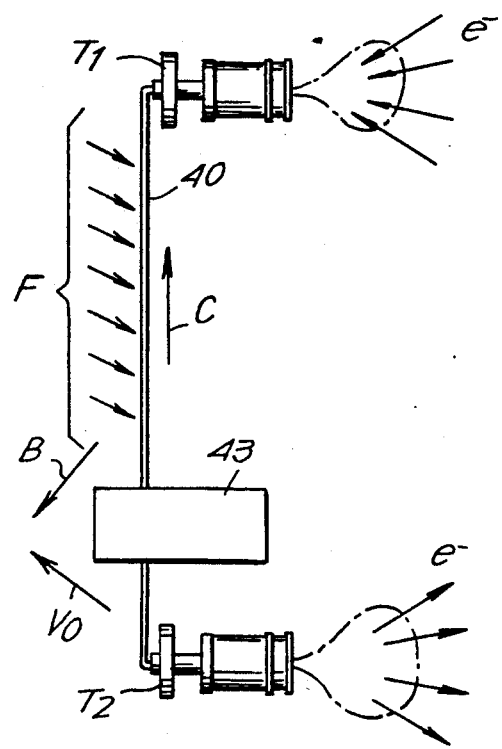
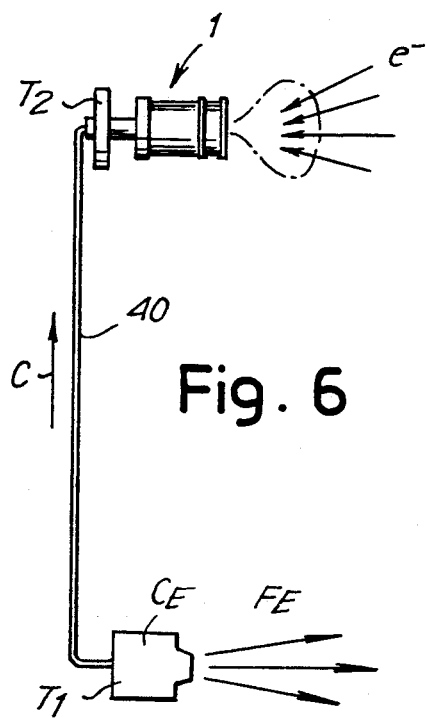
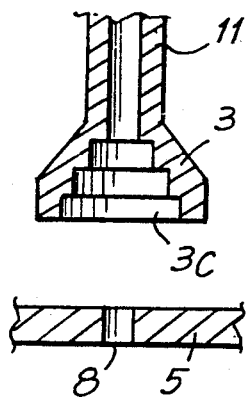
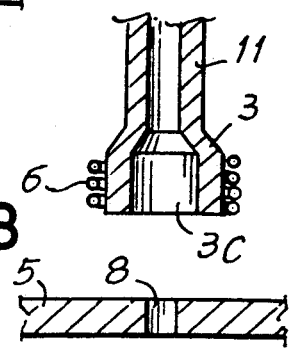

DEVICE WITH UNHEATED HOLLOW CATHODE FOR THE DYNAMIC GENERATION OF PLASMA

FIELD OF THE INVENTION

The invention relates to a plasma generator of the type having a hollow cathode through which a gas is supplied, a containment chamber in which said cathode is enclosed, and an anode disposed in front of said cathode and having one or more holes for the passage of the plasma.

BACKGROUND OF THE INVENTION

Plasma generators of this type which are known at the present time generally have a cathode which is hot, in other words heated electrically, and which terminates in a suitably calibrated nozzle through which the gas supplied through the cavity of the cathode exits. In the terminal region of the cathode, near the nozzle, there is disposed an insert of porous material, for example tungsten, impregnated with materials with a low work function, for example oxides of barium or of calcium.

The hot cathodes of these generators are critical components of the devices, since they are extremely sensitive to the presence of oxygen, moisture and other contaminants present in the gas supplied to their interior or in the environment. For this reason, it is necessary to provide an extremely sophisticated gas supply line, which in most cases comprises expensive devices for eliminating impurities, which devices have to be periodically checked and replaced. Furthermore, the hot cathode requires the presence of a power supply unit, which forms an additional element of the system, which is susceptible to failure, and in any case increases the weight and power consumption of the system. This is a disadvantage particularly for applications in space, and typical of these plasma generators. Another disadvantage of the hot cathode plasma generators is related to the presence of high temperatures in the cathode and in the surrounding regions, which dictates the use of compatible materials, components and processes and requires precise technical design.

SUMMARY AND OBJECTS OF THE PRESENT INVENTION

The object of the present invention is to provide a hollow cathode plasma generating device in which the disadvantages indicated above are eliminated.

These and other objects, which will be clearly understood by experts in the field from a reading of the following text, are attained with a hollow cathode plasma generator of the type mentioned above, wherein said cathode is not heated by an external heat source and has a terminal portion open toward the anode, and said anode has at least one calibrated hole forming a plasma outlet nozzle.

Basically, by using a particular cathode geometry, without a nozzle and shaped with a terminal portion of suitable shape, for example cylindrical, of suitable diameter and length, and an anode with at least one hole calibrated in such a way as to form a plasma outlet nozzle, it is possible to generate plasma even without heating the cathode. By using the unheated cathode, it is possible to eliminate a critical component necessary in the devices used hitherto, and to omit the power generator for the heating of the cathode. The disadvantages arising from the sensitivity of hot cathodes of the known type to the presence of impurities and contaminants in the gas supplied or in the environment are also eliminated. This causes a considerable simplification of the gas supply line, which does not need to be equipped with purification devices.

The cathode may, if necessary, also be cooled by a suitable cooling system. With a cooled cathode it is possible to eliminate all the disadvantages arising from the presence of high temperatures in the cathode and in the surrounding regions.

Finally, greater simplicity and greater reliability are achieved, with consequent economies in design and control, and wider possibilities for the use of the plasma generator.

Further advantageous embodiments of the plasma generator according to the invention are indicated in the attached claims.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIGS. 2 to 6 show, very schematically, various examples of the use of the generator; and FIGS. 7 and 8 show modified embodiments of the cathode

DETAILED DESCRIPTION OF THE PREFERRED EMBODIMENT

Figure 1:
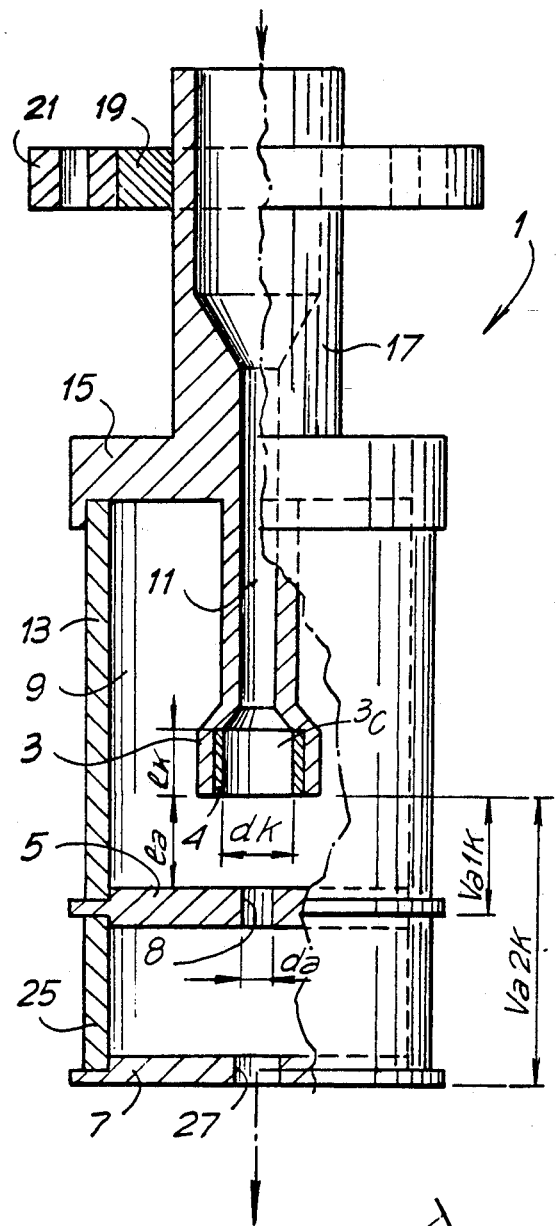
FIG. 1 is a schematic longitudinal section of the generator according to the invention.

FIG. 1 shows a possible embodiment of the generator according to the invention, indicated as a whole by 1, in which are shown the characteristic elements which consist of: a hollow cathode indicated as a whole by 3, one or more anodes 5, 7 (of which 5 is nearest to the cathode 3 and delimits a containment chamber 9), and a gas supply channel 11. The containment chamber 9 is further delimited by a cylindrical insulator 13 (made of ceramic or other suitable insulating material) and by a flange 15 of a support indicated as a whole by 17, mounted, with the interposition of an insulator 19, on a fixing interface 21.

The example in FIG. 1 shows two anodes 5, 7 in series, but obviously the device may also be made with a single anode, or with more than two anodes in series.

Starter and polarization voltages (with respect to the cathode) are applied to the anodes. A gas, usually a noble gas, is introduced into the cathode 3 and then into the containment chamber 9 through the supply channel 11 with a flow capable of creating in the cavity 3C of the cathode 3 the optimal pressure regime for a low-voltage discharge. The desired relation between the flow and pressure of the gas inside the cathode cavity 3C is determined according to the number, shape and dimensions of the anodes.

The cathode consists of a hollow cylinder of homogeneous or non-homogeneous material, which may be in the form of an insert located within the terminal part of the gas supply channel 11. The material may be a metal with a high melting point, or a porous matrix (for example tungsten or graphite) impregnated with a material with a low work function (for example, an alkali metal such as cesium or rubidium, or a mixture of oxides of barium, calcium, aluminum, strontium and similar). However, since the device can also operate with a suitably cooled cathode, materials with a low melting point may also be used for the cathode. In FIG. 1 the cathode has no cooling system, and is formed with a cylindrical insert 4 located in the terminal portion of the channel 11. In the modified embodiment in FIG. 7, the cathode again has no cooling system, and is formed by the same terminal portion of the channel 11. In this case, a different shape of the cathode cavity is also provided, configured as an assembly of portions of cylindrical sections of variable diameter. With this disposition the discharge is initiated in one or other of the portions of the cathode cavity according to the flow conditions, and particularly according to the pressure in the cathode cavity. In the embodiment in FIG. 8, the cathode 3 is again formed by the terminal portion of the channel 11, has a cylindrical or prismatic cathode cavity 3C, and is equipped with a cooling system, schematically indicated by 6.

The cathode 3 is connected to its support 17 by means of the channel 11 which has a section through which the gas flows. This section is made of a material such that the desired thermal regime is obtained for the hollow cathode 3.

Facing the cathode, and at a distance la from it, there is disposed the first, suitably insulated, anode 5, whose shape may be variable, and which according to the invention is perforated at one or more points so that, for a given flow of gas, the desired pressure distribution is established as the regime in the cathode cavity 3C. In the example in FIG. 1 a single hole 8 of diameter da is indicated. The first anode 5 is supported by the insulator 13 which electrically insulates it from the cathode and which has the additional function of confining the gas in the containment chamber, obliging it to exit through the hole in the anode 5. Ultimately, therefore, the pressure regime in the cathode cavity 3C and in the containment chamber is determined by the diameter da of the hole in the anode 5. Said hole therefore has the purpose not only of permitting the exit of the plasma to the exterior of the containment chamber (as is typical of hot cathode generators), but also of determining the pressure gradient between the cathode cavity and the exterior.

The parameters lk and dk (depth and internal diameter of the cathode cavity 3C) and la (distance between cathode 3 and first anode 5) are chosen according to the operating parameters (pressure, starter and discharge voltage, discharge current). Typical values of these parameters vary from fractions of a millimeter to a centimeter and more. Additionally, the ratio lk/dk must be greater than a characteristic value (generally between 1 and 2, and a function of the material of the cathode cavity 3C) to enable the discharge to be initiated in the cathode cavity 3C. The geometry of the containment chamber 9 is chosen in such a way as to prevent initiation and consequently discharge in regions where it is not desired.

The device in FIG. 1 is completed by the additional anode 7, supported by a cylindrical insulator 25 and provided with a hole 27 (or with a number of suitably distributed holes). The diameter of the hole 27 is greater than the diameter da of the hole 8 in the first anode 5. The second anode 7 (and any other additional anodes which are not shown) has the function of facilitating the extraction of electrical charges and of promoting further ionization of the gas.

The electrical power supply to the device is provided by applying a continuous or pulsed voltage between the anode (or anodes) and the hollow cathode 3. At the moment of firing of the device, the voltage applied to the first anode, indicated schematically as Valk, must have a sufficiently high value (of the order of tens or hundreds of volts) to initiate a glow discharge inside the cathode cavity 3C. This value may be reduced by suitable specification of the diameter dk and length lk of the cathode cavity 3C and/or by making the anode in a suitable shape, for example with one or more pointed protuberances directed toward the cathode 3.

After the initiation, the discharge may be transferred to the additional anodes, depending on the voltages applied to them. The voltages applied to the first anode 5 and to the additional anodes must regulate the current associated with the glow discharge in accordance with the desired value.

The additional anodes, such as the anode 7 represented in FIG. 1, may be electrically connected to the first anode and therefore be at the same potential as the first anode with respect to the cathode 3, or may be supplied separately with suitable voltages according to the characteristics required for the plasma produced. In the example in FIG. 1, the anode 7 is maintained at a voltage Va2k which is different from the voltage of the first anode.

Figure 2:
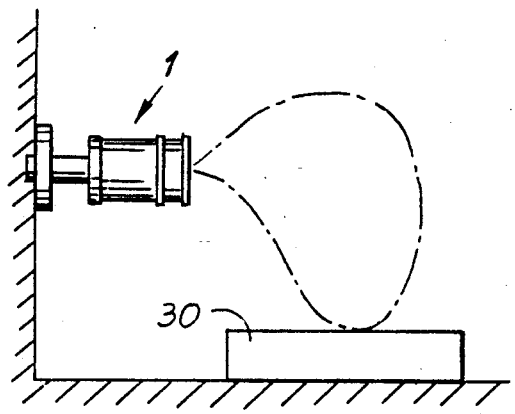
Figure 3:
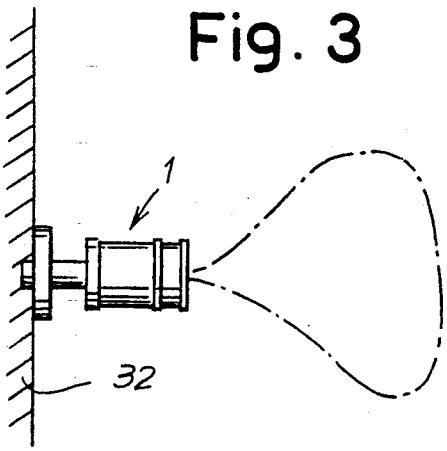
Figure 4:
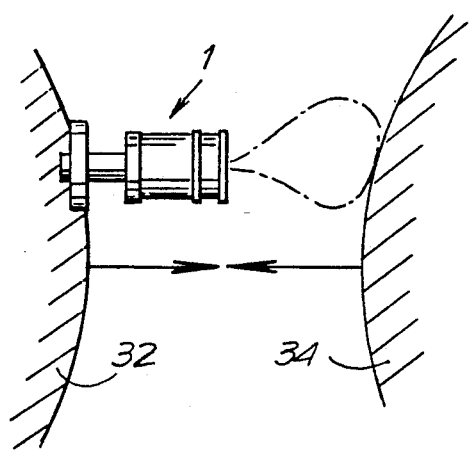

The generator according to the invention may be used for applications in space, for example in the following cases:

discharging of dielectric surfaces or insulated parts of space vehicles; this application is shown schematically in FIG. 2, where 30 indicates the dielectric surface of the vehicle;

plasma contactors for establishing a low-impedance electrical contact between a space vehicle and the ionospheric plasma, or between two space vehicles for docking maneuvers. These two applications are shown in FIGS. 3 and 4 respectively, in which 32 and 34 indicate the two space vehicles;

production of primary plasma in the discharge chambers of ion engines;

production of neutralizing plasma for the beams of ion engines;—production of plasma in ionosphere simulation experiments on earth;

ion generators.

The applications in the industrial field are equally important in all cases in which the production of a plasma is necessary for the treatment of surfaces in a vacuum, such as ion etching, ion implantation, sputtering, and so on. The device may be used advantageously to generate the primary plasma and the neutralizing plasma of ion sources.

Of particular interest among the space applications is the application in tethered systems. This type of application is represented in FIGS. 5A and 5B. More particularly, the figures show the use of two plasma generators according to the invention applied at the ends of the tethered system comprising a cable 40 and an electrical generator 42 (FIG. 5A) or a user 43 (FIG. 5B). In this application, the two plasma contactors 1 have the function of establishing contacts at low impedance between each terminal T1, T2 of the tether and the ambient plasma, with the purpose of minimizing the tether current circulation losses and optimizing the use of the tether for purposes of mechanical propulsion (FIG. 5A)

or electrical power generation (FIG. 5B). F indicates the force acting on the tether, VO the orbital velocity, B the terrestrial magnetic field, C the tether current, and e- the electrons passing from the plasma to the tether or vice versa.

FIG. 6 represents a further application of the generator according to the invention in a tethered system, in which parts identical to those illustrated in FIG. 5 are indicated by the same references. In this case, the plasma generator 1 has the function of establishing a contact at low impedance between the end T2 of the tether and the surrounding plasma, with the purpose of optimizing the use of the system for the generation of electromagnetic waves and for the study of the interactions between the plasma and a beam of electrons FE emitted from a modulatable electron gun CE.

It is to be understood that the drawing shows only an example provided solely as a practical demonstration of the invention, it being possible to vary the invention in its forms and dispositions without thereby departing from the scope of the guiding concept of said invention. Any reference numbers in the attached claims have the purpose of facilitating the reading of the claims with reference to the description and to the drawing, and do not limit the scope of protection represented by the claims.

I claim:

1. A plasma generator of the type comprising a hollow cathode through which a gas is supplied, said cathode defining a cathode cavity at one end of said cathode, said cathode caving having an inside end and an outside end, said outside end being adjacent to said end of said cathode, and said inside end being substantially opposite said outside end, said cathode also defining a gas channel in communication with said inside end of said cathode cavity, said gas channel having a cross sectional area less than a cross sectional area of said cathode cavity, a containment chamber in which said cathode is enclosed, and a first anode disposed in front of said cathode and having a calibrated hole for the passage of the plasma, wherein said cathode is an unheated cathode and said cathode cavity is open toward the anode, and said calibrated hole forming a plasma outlet nozzle, said calibrated hole being of such dimensions and said cross sectional area of said cathode cavity having a size with respect to a gas flow in said gas channel so as to maintain a desired pressure gradient in the containment chamber and an exterior of said containment chamber for the initiation and maintenance of a discharge.

2. The generator as claimed in claim 1, wherein said calibrated hole in the anode is coaxial with the cathode cavity.

3. The generator as claimed in claim 1, wherein additional anodes are in series with said first anode.

4. The generator as claimed in claim 3, wherein said additional anodes are at the same potential as the first anode.

5. The generator as claimed in claim 3, wherein said additional anodes are at different potentials with respect to the first anode.

6. The generator as claimed in claim 1, wherein the cathode is formed from metallic material.

7. The generator as claimed in claim 1, wherein the cathode is formed by a porous matrix impregnated with materials having a low work function.

8. The generator as claimed in claim 7, wherein said matrix is formed from graphite impregnated with cesium or rubidium.

9. The generator as claimed in claim 1, wherein the cathode is made of a material resistant to high temperatures so that it operates even if not cooled.

10. The generator as claimed in claim 1, wherein a cooling system is associated with the cathode.

11. The generator as claimed in claim 1, wherein the cathode cavity has axial symmetry.

12. The generator as claimed in claim 11, wherein said cathode cavity is cylindrical or prismatic, the opening toward the anode having a dimensional equal to a transverse section of the cathode cavity.

13. The plasma generator as claimed in claim 1, wherein a transverse dimension and axial length of the cathode cavity and the distance between the opening of said cathode cavity and the anode are chosen to establish basic operating characteristics of the generator, such as starter voltage, current and discharge voltage.

14. The plasma generator as claimed in claim 1, wherein:
said cross sectional area of said cathode cavity varies from said inside end of said outside end.

15. The plasma generator as claimed in claim 1, wherein:
said cross sectional area of said cathode cavity varies in steps from said inside end to said outside end.

16. The plasma generator as claimed in claim 1, wherein:
said cross sectional area of said cathode cavity has a minimum value at said inside end and a maximum value at said outside end.

17. The plasma generator comprising:
an unheated cathode defining a cathode cavity on one end of said cathode, said cathode also defining a gas channel in communication with said cathode cavity, said gas channel having a cross sectional area less than a cross sectional area of said cathode cavity;
a containment chamber enclosing said cathode;
an anode positioned opposite said cathode, said anode forming a wall of said containment chamber, said anode also defining a calibrated hole, said calibrated hole having a size and said cross sectional area of said cathode cavity having a size with respect to a gas flow in said gas channel to maintain a desired pressure gradient in said containment chamber and an exterior of said containment chamber, said desired pressure gradient and a shape of said cathode cavity providing an environment for initiation of plasma with said cathode being unheated, said desired pressure gradient also providing for maintenance of a plasma discharge between said containment chamber and said exterior.

18. The generator in accordance with claim 17, wherein:
starter voltage, current and discharge voltage of the plasma generator are varied by adjusting an axial length of said cathode cavity, a transverse dimension of said cathode cavity and a distance between said anode and an opening of said cathode cavity.

19. A plasma generator in accordance with claim 18, wherein:
a radio $lk/dk$ between a depth ($lk$) of said cathode cavity and said transverse dimension ($dk$) is 1 or greater.

20. A plasma generator comprising:

a containment chamber;

a cathode positioned inside said containment chamber, said cathode defining a gas channel, said cathode also defining a cathode cavity having an opening inside said containment chamber, said cathode cavity being in communication with said gas channel and said cathode cavity has a cross sectional area with a greater dimension than a cross sectional area of said gas channel;

an anode positioned opposite said opening of said cathode cavity, said anode forming a wall of said containment chamber, said anode also defining a calibrated hole, said calibrated hole having a size and said cross sectional area of said cathode cavity having a size with respect to a gas flow in said gas channel to maintain a desired pressure gradient in said containment chamber and an exterior of said containment chamber, said desired pressure gradient and a shape of said cathode cavity providing an environment for initiation of plasma without additional heat being added to said cathode, said desired pressure gradient also providing for maintenance of a plasma discharge between said containment chamber and said exterior.

* * * * *